(12) United States Patent
Kudoh

(10) Patent No.: US 11,008,462 B2
(45) Date of Patent: May 18, 2021

(54) HEAT-CONDUCTIVE SHEET

(71) Applicant: SEKISUI POLYMATECH CO., LTD., Saitama (JP)

(72) Inventor: Hiroki Kudoh, Kawaguchi (JP)

(73) Assignee: SEKISUI POLYMATECH CO., LTD., Saitama (JP)

( * ) Notice: Subject to any disclaimer, the term of this patent is extended or adjusted under 35 U.S.C. 154(b) by 0 days.

(21) Appl. No.: 16/605,886

(22) PCT Filed: Jun. 25, 2018

(86) PCT No.: PCT/JP2018/024062
§ 371 (c)(1),
(2) Date: Oct. 17, 2019

(87) PCT Pub. No.: WO2019/004150
PCT Pub. Date: Jan. 3, 2019

(65) Prior Publication Data
US 2020/0385577 A1    Dec. 10, 2020

(30) Foreign Application Priority Data

Jun. 27, 2017 (JP) .............................. JP2017-125104

(51) Int. Cl.
*C08J 5/18* (2006.01)
*C08L 83/04* (2006.01)
(Continued)

(52) U.S. Cl.
CPC ............. *C08L 83/04* (2013.01); *C08J 5/18* (2013.01); *H01L 23/36* (2013.01); *C08J 2383/04* (2013.01); *C08K 3/042* (2017.05); *C08K 5/541* (2013.01); *C08K 7/06* (2013.01); *C08K 2201/001* (2013.01); *C08L 2203/20* (2013.01)

(58) Field of Classification Search
None
See application file for complete search history.

(56) References Cited

U.S. PATENT DOCUMENTS 8,808,607 B2 * 8/2014 Usui ...................... C08L 83/14
264/442
10,526,519 B2 * 1/2020 Kanaya ............... H01L 23/3731
(Continued)

FOREIGN PATENT DOCUMENTS

CN     103214853     7/2013
EP     1 186 689     3/2002
(Continued)

OTHER PUBLICATIONS

Office Action dated Jul. 29, 2020 in corresponding Chinese Patent Application No. 201880025974.1, with English translation.
(Continued)

*Primary Examiner* — Robert S Loewe
(74) *Attorney, Agent, or Firm* — Wenderoth, Lind & Ponack, L.L.P.

(57) ABSTRACT

A thermally conductive sheet contains a matrix composed of an organopolysiloxane having a crosslinked structure, a thermally conductive filler dispersed in the matrix, and a silicon compound. The silicon compound is at least one selected from the group consisting of alkoxysilane compounds and alkoxysiloxane compounds.

5 Claims, 1 Drawing Sheet

(51) Int. Cl.
   *H01L 23/36* (2006.01)
   *C08K 3/04* (2006.01)
   *C08K 5/541* (2006.01)
   *C08K 7/06* (2006.01)

(56) References Cited

U.S. PATENT DOCUMENTS

| | | |
|---|---|---|
| 2002/0014692 A1 | 2/2002 | Yamada et al. |
| 2002/0058743 A1 | 5/2002 | Tobita et al. |
| 2002/0090501 A1* | 7/2002 | Tobita ............... H01L 23/3737 428/297.4 |
| 2003/0064017 A1* | 4/2003 | Tobita ..................... C01B 32/20 423/447.2 |
| 2003/0064216 A1* | 4/2003 | Tobita ................... C01B 32/205 428/323 |
| 2003/0129352 A1* | 7/2003 | Takahashi .......... H01L 23/3733 428/68 |
| 2005/0084691 A1 | 4/2005 | Endo et al. |
| 2005/0101719 A1* | 5/2005 | Ishihara ................... C08K 7/06 524/495 |
| 2007/0241303 A1* | 10/2007 | Zhong ..................... C08K 9/04 252/62.3 T |
| 2011/0024675 A1 | 2/2011 | Endo et al. |
| 2011/0311767 A1* | 12/2011 | Elahee ..................... C08K 5/11 428/138 |
| 2013/0136895 A1 | 5/2013 | Usui et al. |
| 2013/0248163 A1* | 9/2013 | Bhagwagar ............. C08L 83/04 165/185 |
| 2014/0264818 A1* | 9/2014 | Lowe, Jr. ............ H01L 23/3736 257/712 |
| 2014/0346710 A1 | 11/2014 | Usui et al. |
| 2014/0349067 A1 | 11/2014 | Usui et al. |
| 2015/0361320 A1* | 12/2015 | Tang .................... C09D 183/06 427/397.7 |
| 2016/0091265 A1* | 3/2016 | Aramaki ................... C08K 3/22 165/185 |
| 2016/0104657 A1* | 4/2016 | Aramaki ............. H01L 23/3737 257/720 |
| 2016/0118316 A1* | 4/2016 | Aramaki ............. H01L 23/3733 257/712 |
| 2016/0141223 A1* | 5/2016 | Aramaki ............. H01L 21/4871 165/133 |
| 2016/0144650 A1 | 5/2016 | Saruyama et al. |
| 2017/0198188 A1 | 7/2017 | Ishihara et al. |
| 2017/0345734 A1* | 11/2017 | Watanabe ................ C09K 5/14 |
| 2018/0163112 A1* | 6/2018 | Watanabe ................ B32B 5/30 |
| 2018/0292148 A1* | 10/2018 | Watanabe ............... B32B 27/20 |
| 2019/0002694 A1* | 1/2019 | Akiba ................. H01L 23/3737 |
| 2019/0292349 A1* | 9/2019 | Ito ............................ C08K 3/28 |
| 2020/0270498 A1* | 8/2020 | Endo ....................... C08G 77/04 |

FOREIGN PATENT DOCUMENTS

| | | |
|---|---|---|
| EP | 2 583 993 | 4/2013 |
| JP | 8-295737 | 11/1996 |
| JP | 2000-191812 | 7/2000 |
| JP | 2002-3718 | 1/2002 |
| JP | 2005-112961 | 4/2005 |
| JP | 2005-146057 | 6/2005 |
| JP | 2009-209165 | 9/2009 |
| JP | 2010-174139 | 8/2010 |
| JP | 2011-165792 | 8/2011 |
| JP | 2015-233104 | 12/2015 |
| WO | 2014/196347 | 12/2014 |
| WO | 2015/170514 | 11/2015 |

OTHER PUBLICATIONS

Cui Shuling, "High-Tech Fibers", China Textile Publishing House, 1st Edition, 2016, pp. 68-69.

Extended European Search Report dated Jun. 18, 2020 in corresponding European Patent Application No. 18824099.8.

International Search Report dated Sep. 25, 2018 in International Application No. PCT/JP2018/024062, with English translation.

* cited by examiner

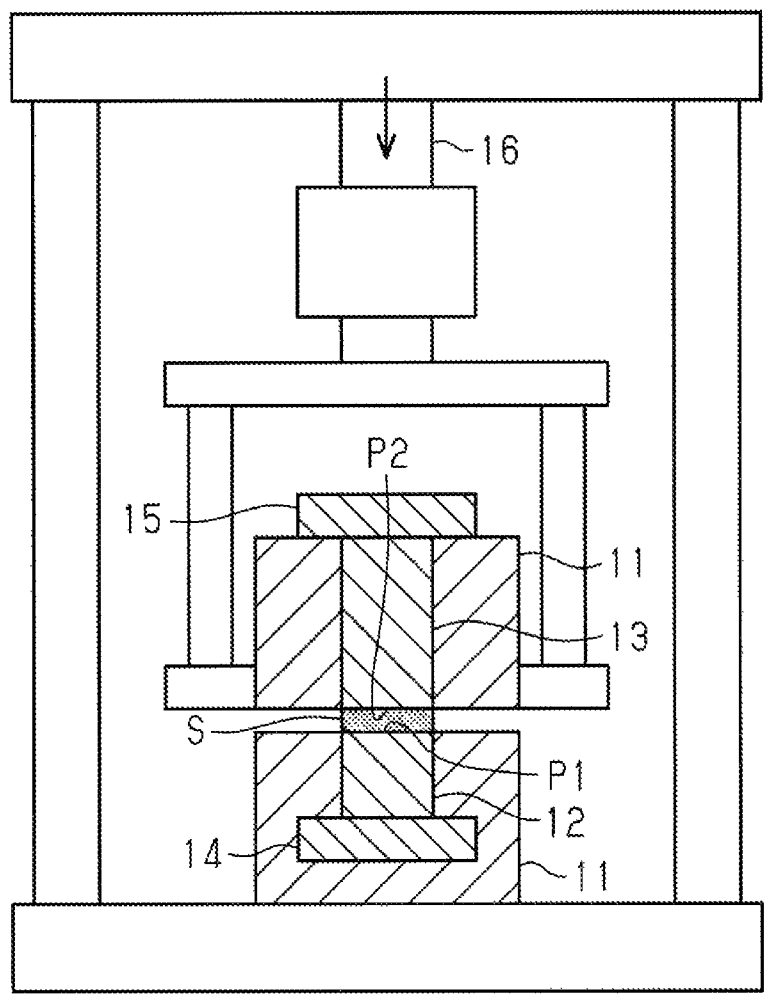

HEAT-CONDUCTIVE SHEET

TECHNICAL FIELD

The present invention relates to a thermally conductive sheet to be disposed between a heat-generating body and a heat-dissipating body.

BACKGROUND ART

In electronic equipment such as computers and automobile parts, heat-dissipating bodies such as heat sinks are used in order to dissipate heat produced from heat-generating bodies such as semiconductor devices and machine parts. A thermally conductive sheet may be disposed between such a heat-generating body and heat-dissipating body for the purpose of enhancing the heat transfer efficiency from the heat-generating body to the heat-dissipating body. For example, PTL 1 discloses a thermally conductive sheet comprising a matrix and a thermally conductive filler.

CITATION LIST

Patent Literature

PTL 1: JP 2005-146057 A

SUMMARY OF INVENTION

Technical Problem

In recent years, the miniaturization and performance enhancement of electronic equipment have advanced, and thus the amount of heat generated in heat-generating bodies has tended to increase. Therefore, thermally conductive sheets for transferring heat from heat-generating bodies to heat-dissipating bodies are also required to exhibit higher thermal conductivity.

It is an object of the present invention to provide a thermally conductive sheet that can exhibit higher thermal conductivity.

Solution to Problem

In order to achieve the above object, in one aspect of the present invention, a thermally conductive sheet comprises a matrix composed of an organopolysiloxane having a crosslinked structure; a thermally conductive filler dispersed in the matrix; and at least one silicon compound selected from the group consisting of alkoxysilane compounds and alkoxysiloxane compounds.

Advantageous Effects of Invention

According to the present invention, higher thermal conductivity can be exhibited thereby.

BRIEF DESCRIPTION OF DRAWING

FIG. 1 is a schematic diagram showing a thermal resistance measuring machine.

DESCRIPTION OF EMBODIMENT

An embodiment of a thermally conductive sheet will be illustrated below.

A thermally conductive sheet comprises a matrix composed of an organopolysiloxane having a crosslinked structure, a thermally conductive filler dispersed in the matrix, and a silicon compound. The silicon compound is at least one selected from the group consisting of alkoxysilane compounds and alkoxysiloxane compounds.

Matrix

The matrix holds the thermally conductive filler and maintains the thermally conductive sheet in a predetermined shape. The matrix is formed by curing a liquid organopolysiloxane that is a precursor of the matrix. The liquid organopolysiloxane has a reactive group capable of forming a crosslinked structure. Examples of the liquid organopolysiloxane include condensation type organopolysiloxanes and addition reaction type organopolysiloxanes. The liquid organopolysiloxane preferably comprises an addition reaction type organopolysiloxane, because high filling with the thermally conductive filler is easy, and the curing temperature can be easily adjusted with a catalyst or the like. The addition reaction type organopolysiloxane preferably comprises an alkenyl group-containing organopolysiloxane and a hydrogen organopolysiloxane, from the viewpoint that high filling with the thermally conductive filler is easy. As used herein, the term "liquid" refers to a substance that is a liquid at 23° C. under 1 atm.

The curing temperature $T_1$ (° C.) of the liquid organopolysiloxane is preferably set considering the volatility of the above silicon compound. The volatility of the silicon compound can be represented by the temperature $T_2$ (° C.) at which the proportion of decrease in mass reaches 60%, or the temperature $T_3$ (° C.) at which the proportion of decrease in mass reaches 5%, in a thermogravimetric analysis under such a condition that the temperature is elevated from a heating start temperature of 25° C. at a heating-up rate of 10° C./min. In other words, it can be said that the silicon compound has higher volatility, as the temperature $T_2$ (° C.) or the temperature $T_3$ (° C.) is lower. The thermogravimetric analysis can be performed under a nitrogen atmosphere.

The curing temperature $T_1$ (° C.) of the liquid organopolysiloxane, and the temperature $T_2$ (° C.) of the silicon compound obtained from the above thermogravimetric analysis preferably satisfy the following formula (1):

$$T_1 \leq T_2 \tag{1}$$

The curing temperature $T_1$ (° C.) of the liquid organopolysiloxane, and the temperature $T_3$ (° C.) of the silicon compound obtained from the above thermogravimetric analysis preferably satisfy the following formula (2):

$$T_1 \leq T_3 \tag{2}$$

By setting the curing temperature $T_1$ (° C.) of the liquid organopolysiloxane as described above, the volatilization of the silicon compound can be suppressed when the liquid organopolysiloxane is cured. In addition, the generation of bubbles in the organopolysiloxane can also be suppressed, and therefore a decrease in thermal conductivity caused by the bubbles in the thermally conductive sheet can be suppressed.

Thermally Conductive Filler

Examples of the material of the thermally conductive filler include metals, carbon, metal oxides, metal nitrides, metal carbides, and metal hydroxides. Examples of the metals include copper and aluminum. Examples of the carbon include pitch-based carbon fibers, PAN-based carbon fibers, fibers obtained by carbonizing resin fibers, fibers obtained by graphitizing resin fibers, and graphite powders.

Examples of the metal oxides include aluminum oxide, magnesium oxide, zinc oxide, iron oxide, and quartz, and examples of the metal nitrides include boron nitride and aluminum nitride. Examples of the metal carbides include silicon carbide, and examples of the metal hydroxides include aluminum hydroxide.

The shape of the thermally conductive filler may be a spherical shape or a nonspherical shape (a shape having anisotropy) such as a fibrous shape or a plate shape. The thermally conductive filler preferably comprises a plurality of spherical particle groups having different average particle diameters. In such a case, the viscosity of the thermally conductive composition that is the raw material before the thermally conductive sheet is formed therefrom can be reduced. In other words, a thermally conductive composition highly filled with the thermally conductive filler is obtained at a predetermined viscosity, and therefore the moldability of the thermally conductive composition can be ensured, and the thermal conductivity of the thermally conductive sheet can be improved.

Among the thermally conductive fillers, carbon fibers and graphite powders have anisotropy in shape. Therefore, when carbon fibers or graphite powders are used, the carbon fibers or the graphite powders can also be oriented in a fixed direction in the liquid organopolysiloxane. Thus, a thermally conductive sheet in which the thermally conductive filler is oriented in a fixed direction is obtained, and therefore the thermal conductivity in the direction in which the thermally conductive filler is oriented can be improved.

The content of the thermally conductive filler in the thermally conductive sheet is preferably 300 to 1700 parts by mass, more preferably 300 to 800 parts by mass, based on 100 parts by mass of the matrix. As the content of the thermally conductive filler increases, the thermal conductivity of the thermally conductive sheet can be increased. As the content of the thermally conductive filler decreases, the viscosity of the thermally conductive composition decreases, and therefore the thermally conductive sheet is easily molded. The viscosity of the thermally conductive composition is preferably 500 Pa·s or less at 25° C.

Silicon Compound

The at least one silicon compound selected from the group consisting of alkoxysilane compounds and alkoxysiloxane compounds increases the thermal conductivity of the thermally conductive sheet. First, the alkoxysilane compound will be described. The alkoxysilane compound is a compound having a structure in which one to three of the four bonds that a silicon atom (Si) has are bonded to an alkoxy group or alkoxy groups, and the remaining bond or bonds are bonded to an organic substituent or organic substituents. Examples of the alkoxy group that the alkoxysilane compound has include a methoxy group, an ethoxy group, a propoxy group, a butoxy group, a pentyloxy group, and a hexyloxy group. The alkoxysilane compound may be contained in the thermally conductive sheet as a dimer.

Among alkoxysilane compounds, alkoxysilane compounds having a methoxy group or an ethoxy group are preferred from the viewpoint of easy availability. The number of alkoxy groups that the alkoxysilane compound has is preferably 3 from the viewpoint of enhancing the affinity for an inorganic matter which is used as the thermally conductive filler. The alkoxysilane compound is more preferably at least one selected from the group consisting of a trimethoxysilane compounds and a triethoxysilane compounds.

Examples of the functional group included in the organic substituent that the alkoxysilane compound has include an acryloyl group, an alkyl group, a carboxyl group, a vinyl group, a methacrylic group, an aromatic group, an amino group, an isocyanate group, an isocyanurate group, an epoxy group, a hydroxyl group, and a mercapto group. Here, when an addition reaction type organopolysiloxane comprising a platinum catalyst is used as the above precursor of the matrix, an alkoxysilane compound less likely to influence the curing reaction of the organopolysiloxane is preferably selected and used. Specifically, when an addition reaction type organopolysiloxane comprising a platinum catalyst is used, the organic substituent of the alkoxysilane compound preferably does not comprise an amino group, an isocyanate group, an isocyanurate group, a hydroxyl group, or a mercapto group.

The alkoxysilane compound preferably comprises an alkylalkoxysilane compounds having an alkyl group bonded to a silicon atom, that is, an alkoxysilane compounds having an alkyl group as an organic substituent, because by increasing the dispersibility of the thermally conductive filler, high filling with the thermally conductive filler becomes easy. The number of carbon atoms of the alkyl group bonded to the silicon atom is preferably 4 or more. The number of carbon atoms of the alkyl group bonded to the silicon atom is preferably 16 or less from the viewpoint that the viscosity of the alkoxysilane compound itself is relatively low, and the viscosity of the thermally conductive composition is kept low.

One or two or more types of alkoxysilane compounds can be used. Specific examples of the alkoxysilane compound include alkyl group-containing alkoxysilane compounds, vinyl group-containing alkoxysilane compounds, acryloyl group-containing alkoxysilane compounds, methacrylic group-containing alkoxysilane compounds, aromatic group-containing alkoxysilane compounds, amino group-containing alkoxysilane compounds, isocyanate group-containing alkoxysilane compounds, isocyanurate group-containing alkoxysilane compounds, epoxy group-containing alkoxysilane compounds, and mercapto group-containing alkoxysilane compounds.

Examples of the alkyl group-containing alkoxysilane compounds include methyltrimethoxysilane, dimethyldimethoxysilane, trimethylmethoxysilane, methyltriethoxysilane, dimethyldiethoxysilane, ethyltrimethoxysilane, n-propyltrimethoxysilane, n-propyltriethoxysilane, isobutyltrimethoxysilane, isobutyltriethoxysilane, n-hexyltrimethoxysilane, n-hexyltriethoxysilane, cyclohexylmethyldimethoxysilane, n-octyltriethoxysilane, and n-decyltrimethoxysilane. Among the alkyl group-containing alkoxysilane compounds, at least one selected from the group consisting of isobutyltrimethoxysilane, isobutyltriethoxysilane, n-hexyltrimethoxysilane, n-hexyltriethoxysilane, cyclohexylmethyldimethoxysilane, n-octyltriethoxysilane, and n-decyltrimethoxysilane is preferred.

Examples of the vinyl group-containing alkoxysilane compounds include vinyltrimethoxysilane and vinyltriethoxysilane. Examples of the acryloyl group-containing alkoxysilane compounds include 3-acryloxypropyltrimethoxysilane. Examples of the methacrylic group-containing alkoxysilane compounds include 3-methacryloxypropylmethyldimethoxysilane, 3-methacryloxypropyltrimethoxysilane, and 3-methacryloxypropyltriethoxysilane. Examples of the aromatic group-containing alkoxysilane compounds include phenyltrimethoxysilane and phenyltriethoxysilane. Examples of the amino group-containing alkoxysilane compounds include N-2-(aminoethyl)-3-aminopropylmethyldimethoxysilane, N-2-(aminoethyl)-3-aminopropyltrimethoxysilane, 3-aminopropyltrimethoxysilane, 3-aminopropyltriethoxysilane, and N-phenyl-3-aminopropyltrimethoxysilane. Examples of the isocyanate group-containing alkoxysilane compounds include 3-isocyanatepropyltriethoxysilane. Examples of the isocyanurate group-containing alkoxysilane compounds include tris-(trimethoxysilylpropyl) isocyanurate. Examples of the epoxy group-containing alkoxysilane compounds include 2-(3,4-epoxycyclohexyl)ethyltrimethoxysilane, 3-glycidoxypropylmethyldimethoxysilane, 3-glycidoxypropyltrimethoxysilane, and 3-glycidoxypropyltriethoxysilane. Examples of the mercapto group-containing alkoxysilane compounds include 3-mercaptopropyltrimethoxysilane.

The above specific examples of the alkoxysilane compound are examples, and the scope of alkoxysilane compound is not limited to these.

Next, the alkoxysiloxane compound will be described.

The alkoxysiloxane compound has a structure in which it has two or more siloxane bonds, and an alkoxy group is bonded to at least one silicon atom. In addition, the alkoxysiloxane compound has a structure in which an organic substituent is bonded to at least one of the silicon atoms constituting the siloxane bonds.

Examples of the alkoxy group and the organic substituent that the alkoxysiloxane compound has can include those illustrated in the above description of the alkoxysilane compound. The alkoxysiloxane compound has an alkoxy group, in similar to the alkoxysilane compound, and therefore can enhance the affinity for the inorganic matter that is used as the thermally conductive filler. In addition, the alkoxysiloxane compound has a siloxane structure and therefore also has a good affinity for the organopolysiloxane that is the matrix.

The organic substituent of the alkoxysiloxane compound preferably comprises the functional group that the liquid organopolysiloxane has, from the viewpoint of enhancing the affinity for the liquid organopolysiloxane that is the precursor of the matrix. For example, when an organopolysiloxane having a dimethylsiloxane skeleton is used as the precursor of the matrix, the organic substituent that the alkoxysiloxane compound has preferably comprises a methyl group. The organic substituent of the alkoxysiloxane compound can enhance the affinity for the liquid organopolysiloxane, even when it comprises an aromatic group (for example, a phenyl group).

One or two or more types of alkoxysiloxane compounds can be used. Examples of the alkoxysiloxane compound include methylmethoxysiloxane oligomers, methylphenylmethoxysiloxane oligomers, methylepoxymethoxysiloxane oligomers, methylmercaptomethoxysiloxane oligomers, and methylacryloylmethoxysiloxane oligomers.

Here, the volatility of the silicon compound described above can be represented by the proportion of decrease in mass that is measured at a point in time when 60 min has passed from a heating start by a thermogravimetric analysis under a condition where temperature is elevated to 100° C. from a heating start temperature of 25° C. at a heating-up rate of 10° C./min and then kept constant at 100° C. The thermogravimetric analysis can be performed under a nitrogen atmosphere.

When a compound for which the proportion of decrease in mass being measured by the thermogravimetric analysis is in the range of 5% or more and 60% or less (high-volatile compound), among silicon compounds, is used, the viscosity of the silicon compound, that is, the viscosity of the thermally conductive composition, can be kept low, and therefore the formation of the thermally conductive sheet is easy.

When a compound for which the proportion of decrease in mass being measured by the thermogravimetric analysis is less than 5% (low-volatile compound), among silicon compounds, is used, a thermally conductive sheet in which the heat resistance is excellent, and the changes in physical properties are small in long-term use can be obtained. In addition, the volatilization of the silicon compound in the curing process of the precursor of the matrix can be suppressed, and therefore, for example, the amount of the silicon compound used can be reduced. Further, the above proportion of decrease being measured for the low-volatile compound is 0% or more.

Among silicon compounds, many alkoxysiloxane compounds have a higher molecular weight than alkoxysilane compounds. In other words, many alkoxysiloxane compounds have lower volatility than alkoxysilane compounds, and therefore as the low-volatile compound, an alkoxysiloxane compound can be preferably used. In other words, as the above-described high-volatile compound, an alkoxysilane compound can be preferably used.

The volatility of the alkoxysiloxane compound is relatively low, and the viscosity thereof tends to be low, and therefore the viscosity of the thermally conductive composition can be kept low. Therefore, by using the alkoxysiloxane compound as the low-volatile compound, the formation of the thermally conductive sheet is easy.

The silicon compound preferably comprises both the high-volatile compound and the low-volatile compound. In such a case, the thermal conductivity of the thermally conductive sheet can be more increased by use of the high-volatile compound, and a thermally conductive sheet in which the changes in physical properties are small in long-term use can be obtained by use of the low-volatile compound.

In the case when the silicon compound comprises the high-volatile compound and the low-volatile compound, the content of the low-volatile compound in the thermally conductive sheet is preferably higher than the content of the high-volatile compound. The proportion of the mass of the low-volatile compound is more preferably in the range of 70 to 99% by mass to the total mass of the high-volatile compound and the low-volatile compound. In the case when the proportion of the mass of the low-volatile compound is 70% by mass or more, a thermally conductive sheet in which the heat resistance is better, and the changes in physical properties are smaller in long-term use can be obtained.

The silicon compound preferably comprises a compound having a viscosity in the range of 1 mPa·s or more and 10000 mPa·s or less at 25° C. In such a case, the viscosity of the thermally conductive composition can be kept low, and therefore the formation of the thermally conductive sheet is easy. The viscosity of the silicon compound can be measured by a rotational viscometer, and the measurement temperature is 25° C.

The proportion of the mass of the silicon compound to the total mass of the matrix and the silicon compound is preferably 0.1% by mass or more, more preferably 0.5% by mass or more, and further preferably 1% by mass or more. The thermal conductivity of the thermally conductive sheet tends to increase as the proportion of the mass of the silicon compound is increased.

The proportion of the mass of the silicon compound to the total mass of the matrix and the silicon compound is preferably 50% by mass or less, more preferably 40% by mass or less. By reducing the proportion of the mass of the silicon compound, the proportion of the matrix in the thermally conductive sheet can be relatively increased, and therefore the strength of the thermally conductive sheet can be improved. Thus, for example, cracks are less likely to occur in the surface of the thermally conductive sheet.

In the case when the silicon compound comprises the alkoxysilane compound, the proportion of the mass of the alkoxysilane compound to the total mass of the matrix and the alkoxysilane compound is preferably 10% by mass or less, more preferably 7% by mass or less. By reducing the proportion of the mass of the alkoxysilane compound, a thermally conductive sheet in which the changes in physical properties are smaller in long-term use can be obtained. The proportion of the mass of the alkoxysilane compound to the total mass of the matrix and the alkoxysilane compound is preferably 0.1% by mass or more.

In the case when the silicon compound comprises the alkoxysiloxane compound, the proportion of the mass of the alkoxysiloxane compound to the total mass of the matrix and the alkoxysiloxane compound is preferably 5% by mass or more, more preferably 10% by mass or more. By setting the proportion of the mass of the alkoxysiloxane compound high, the flexibility of the thermally conductive sheet can be increased. Further, the proportion of the mass of the alkoxysiloxane compound to the total mass of the matrix and the alkoxysiloxane compound is preferably 50% by mass or less.

Additive

An additive for improving the performance of the thermally conductive composition and the thermally conductive sheet can also be further contained in the thermally conductive sheet as needed. Examples of the additive include reinforcing materials, colorants, heat resistance-improving agents, surfactants, dispersing agents, flame retardants, catalysts, curing retarders, deterioration-preventing agents, and plasticizers.

Uses and Functions of Thermally Conductive Sheet

The thermally conductive sheet is used by being disposed between a heat-generating body and a heat-dissipating body. The thickness of the thermally conductive sheet is, for example, in the range of 0.5 mm to 10 mm. The thermally conductive sheet is preferably disposed in a state of being compressed in the thickness direction between a heat-generating body and a heat-dissipating body. Examples of the heat-generating body include semiconductor devices such as CPUs, and machine parts. Examples of the heat-dissipating body include heat sinks and housings.

The silicon compound is contained in the thermally conductive sheet according to this embodiment in the above proportion of mass. It is presumed that, for example, by dispersing the silicon compound comprised in the thermally conductive sheet, in such a proportion, in the matrix together with the thermally conductive filler, the function of the thermally conductive filler is sufficiently exhibited. Thus, the thermally conductive sheet can exhibit in the thickness direction, for example, a high thermal conductivity of 14 W/m·K or more.

In the thermally conductive sheet, its E hardness measured according to the provisions of JIS K6253 with a type E durometer is preferably in the range of E5 to E90. In the case when the E hardness of the thermally conductive sheet is E5 or more, the handling properties of the thermally conductive sheet are good. In the case when the E hardness of the thermally conductive sheet is E90 or less, the thermally conductive sheet easily follows the shape of a heat-generating body and a heat-dissipating body, and the adhesiveness of the thermally conductive sheet to the heat-generating body and the heat-dissipating body is ensured, and thus the thermal resistance between the heat-generating body and the thermally conductive sheet or between the heat-dissipating body and the thermally conductive sheet can be reduced.

Production of Thermally Conductive Sheet

The thermally conductive sheet can be obtained from a thermally conductive composition. The thermally conductive composition is obtained by mixing predetermined amounts of a precursor of a matrix, a thermally conductive filler, and a silicon compound. In detail, a method for producing a thermally conductive composition comprises the dispersion step of dispersing a thermally conductive filler in a precursor of a matrix, and the blending step of blending a silicon compound therein. The blending step of blending a silicon compound may be performed with any timing selected from before the dispersion step, after the dispersion step, or simultaneously with the dispersion step. The thermally conductive composition may be blended with the above additive, as needed. A well-known stirrer or disperser can be used for the dispersion step and the blending step. The thermally conductive sheet can be obtained by carrying out the curing step of curing the precursor of the matrix comprised in the thermally conductive composition.

Here, the silicon compound mixed in the thermally conductive composition, for example, may be coupled on to the surface of the thermally conductive filler to constitute part of the surface-modified thermally conductive filler. In addition, the silicon compound blended in the thermally conductive composition may volatilize when the precursor of the matrix is cured to obtain the thermally conductive sheet. Therefore, the content of the silicon compound in the thermally conductive composition should be adjusted considering the amount consumed by the reaction of the silicon compound with other compounds, and the amount removed by volatilization, in the production process of the thermally conductive sheet. For example, in the case when the above-described high-volatile compound is used as the silicon compound, the high-volatile compound should be mixed to the thermally conductive composition in such a large amount as about 10 times the above proportion of mass to be comprised in the thermally conductive sheet, by taking account of the amount of the high-volatile compound volatilized, and the like.

In the case when the thermally conductive composition is blended with the above-described high-volatile compound and low-volatile compound as the silicon compound, a thermally conductive sheet containing substantially no high-volatile compound can be obtained by reacting and volatilizing the entire high-volatile compound. Further, in the case when the thermally conductive composition is blended with the above-described high-volatile compound and low-volatile compound as the silicon compound, a thermally conductive sheet that comprises the high-volatile compound and the low-volatile compound, wherein a content ratio of the low-volatile compound is higher than that of the high-volatile compound, can also be obtained by reacting and volatilizing part of the high-volatile compound. Furthermore, the content of the silicon compound comprised in the thermally conductive sheet can also be adjusted by volatilizing the silicon compound by post-processing in which the thermally conductive sheet is heated.

The content of the silicon compound comprised in the thermally conductive composition is preferably 5 parts by mass or more, more preferably 10 parts by mass or more, based on 100 parts by mass of the precursor of the matrix. The content of the silicon compound comprised in the thermally conductive composition is preferably 70 parts by mass or less, more preferably 50 parts by mass or less, based on 100 parts by mass of the precursor of the matrix.

In the curing step, the thermally conductive composition is heated to form an organopolysiloxane having a crosslinked structure from the precursor of the matrix. In the curing step, the thermally conductive composition is heated so as to reach a temperature equal to or more than the curing temperature T1 of the liquid organopolysiloxane that is used as the precursor of the matrix. In the curing step, the thermally conductive composition is heated so that at least part of the silicon compound blended in the thermally conductive composition is left in an unreacted state in the thermally conductive sheet.

The amount of the silicon compound volatilized in the curing step is preferably in the range of 0 to 91% by mass, based on the entire silicon compound blended in the thermally conductive composition. In the case when the silicon compound comprises the high-volatile compound, the amount of the high-volatile compound volatilized in the curing step is preferably in the range of 20 to 91% by mass, based on the entire high-volatile compound blended in the thermally conductive composition. Thereby, the content of the high-volatile compound in the thermally conductive sheet can be reduced, and thus, a thermally conductive sheet in which the changes in physical properties are small in long-term use can be obtained.

In the case when the silicon compound comprises the low-volatile compound, the amount of the low-volatile compound volatilized in the curing step is preferably in the range of 0 to 20% by mass, based on the entire low-volatile compound blended in the thermally conductive composition. When the amount volatilized is small in such a manner, the generation of bubbles can also be suppressed, and therefore a decrease in thermal conductivity caused by the bubbles in the thermally conductive sheet can be suppressed.

The curing step may be the step of heating the thermally conductive composition injected into a mold, or the step of heating the thermally conductive composition applied to a substrate such as a resin film or a metal plate. In the case when a thermally conductive filler having a shape with anisotropy is used as the thermally conductive filler, a thermally conductive sheet in which the thermally conductive filler is oriented in the thickness direction of the thermally conductive sheet can also be obtained by applying a magnetic field to the thermally conductive composition before the curing step in a well-known manner. Further, the thermally conductive sheet may be formed by cutting the cured product of the thermally conductive composition to a predetermined thickness.

Moreover, for the volatilization of the silicon compound, the amount volatilized can also be adjusted by carrying out a predetermined heating step, in addition to the curing step. Also in such a case, the amount of the silicon compound volatilized is preferably in the range of 0 to 91% by mass, based on the entire silicon compound blended in the thermally conductive composition.

According to the embodiment described in detail above, the following effects are exhibited.

(1) A thermally conductive sheet comprises a matrix composed of an organopolysiloxane having a crosslinked structure, a thermally conductive filler dispersed in the matrix, and a silicon compound. The silicon compound is at least one selected from the group consisting of alkoxysilane compounds and alkoxysiloxane compounds. According to this structure, higher thermal conductivity can be exhibited.

(2) In the thermally conductive sheet, the proportion of the mass of the silicon compound to the total mass of the matrix and the silicon compound is preferably 0.1% by mass or more and 50% by mass or less. In such a case, the thermal conductivity of the thermally conductive sheet can be more increased, and cracks are less likely to occur in the surface of the thermally conductive sheet as well.

(3) In the thermally conductive sheet, in the case when the silicon compound comprises the alkoxysilane compound, the proportion of the mass of the alkoxysilane compound to the total mass of the matrix and the alkoxysilane compound is preferably 0.1% by mass or more and 10% by mass or less. In such a case, the thermal conductivity of the thermally conductive sheet can be more increased, and a thermally conductive sheet in which the changes in physical properties are smaller in long-term use can be obtained as well.

(4) In the thermally conductive sheet, in the case when the silicon compound comprises the alkoxysiloxane compound, the proportion of the mass of the alkoxysiloxane compound to the total mass of the matrix and the alkoxysiloxane compound is preferably 5% by mass or more and 50% by mass or less. In such a case, the flexibility of the thermally conductive sheet can be increased, and cracks are less likely to occur in the surface of the thermally conductive sheet as well. Thereby, the adhesiveness of the thermally conductive sheet to a heat-generating body and a heat-dissipating body increases, and thus the thermal resistance between the heat-generating body and the thermally conductive sheet or between the heat-dissipating body and the thermally conductive sheet can be reduced. Therefore, higher thermal conductivity can be exhibited.

(5) In the case when the silicon compound comprises in the thermally conductive sheet comprises the above-described high-volatile compound, higher thermal conductivity can be exhibited.

(6) In the case when the silicon compound comprised in the thermally conductive sheet comprises the above-described low-volatile compound, a thermally conductive sheet in which the heat resistance is excellent, and the changes in physical properties are small in long-term use can be obtained.

(7) The silicon compound comprised in the thermally conductive sheet preferably comprises a compound having an alkyl group bonded to a silicon atom. In such a case, by increasing the dispersibility of the thermally conductive filler, high filling with the thermally conductive filler becomes easy, and therefore higher thermal conductivity can be exhibited.

Technical ideas that can be grasped from the above embodiment will be described below.

(a) A thermally conductive composition used for the purpose of producing a thermally conductive sheet, comprising a liquid precursor for obtaining a matrix composed of an organopolysiloxane having a crosslinked structure; a thermally conductive filler; and at least one silicon compound selected from the group consisting of alkoxysilane compounds and alkoxysiloxane compounds, wherein the content of the silicon compound is 5 parts by mass or more, based on 100 parts by mass of the precursor.

(b) A method for producing a thermally conductive sheet, comprising the curing step of curing the precursor comprised in the above thermally conductive composition.

EXAMPLES

Next, Examples and Comparative Examples will be described.

Example 1

In Example 1, a precursor of a matrix, an alkoxysilane compound that was a silicon compound, a thermally conductive filler (A), a thermally conductive filler (B), a thermally conductive filler (C), and a plasticizer were mixed to prepare a thermally conductive composition. As the precursor of the matrix, a mixture of an alkenyl group-containing organopolysiloxane and a hydrogen organopolysiloxane was used. As the alkoxysilane compound, which was a silicon compound, n-octyltriethoxysilane was used. The proportion of decrease in the mass of n-octyltriethoxysilane measured in thermogravimetric analysis is 16.6%, the temperature T2 at which the proportion of decrease reaches 60% is 197° C., and the temperature T3 at which the proportion of decrease reaches 5% is 84° C. The viscosity (25° C.) of n-octyltriethoxysilane is 10 mPa·s.

The thermally conductive filler (A) is a graphitized carbon fiber (average fiber length: 150 μm). The thermally conductive filler (B) is an aluminum oxide powder (spherical, average particle diameter: 5 μm). The thermally conductive filler (C) is an aluminum oxide powder (spherical, average particle diameter: 1 μm). As the plasticizer, dimethylpolysiloxane (viscosity (25° C.): 1000 mPa·s) was used.

The amounts of the raw materials blended in the thermally conductive composition are shown in Table 1. The units of the amounts blended shown in Table 1 are parts by mass.

Next, the thermally conductive composition was injected into a mold with a cavity having a sheet shape, and a magnetic field of 8T was applied in the thickness direction to orient the graphitized carbon fibers of the thermally conductive filler (A) in the thickness direction. Then, the thermally conductive composition was heated under conditions of 80° C. and 60 min, and further heated under conditions of a temperature of 150° C. and 120 min as a curing step to cure the precursor of the matrix. Thereby, the thermally conductive sheet of Example 1 was obtained.

Examples 2 to 8 and Comparative Examples 1 to 3

Thermally conductive sheets were obtained in the same manner as in Example 1, except that the blend in the thermally conductive composition was changed as shown in Table 1 and Table 2. In Examples 5 to 8 shown in Table 2, as the alkoxysiloxane compound, which was a silicon compound, a methylmethoxysiloxane oligomer was used. The proportion of decrease in the mass of the methylmethoxysiloxane oligomer measured in thermogravimetric analysis is 0.2%, the temperature T2 at which the proportion of decrease reaches 60% is 300° C. or more, and the temperature T3 at which the proportion of decrease reaches 5% is 205° C. The viscosity (25° C.) of the methylmethoxysiloxane oligomer is 100 mPa·s. The units of the amounts blended shown in Table 2 are parts by mass. In each example, the amounts blended were adjusted so that the total amount of the precursor of the matrix, the silicon compound, and the plasticizer was 170 parts by mass.

Viscosity of Thermally Conductive Compositions

The viscosity of the above thermally conductive compositions was measured under conditions of a rotational speed of 10 rpm and a measurement temperature of 25° C. by using a viscometer (rotational viscometer, manufactured by BROOKFIELD, DV-E) with a rotor of spindle No. 14. The results are shown in the "Viscosity of thermally conductive composition" columns in Table 1 and Table 2.

Content of Silicon Compound in Thermally Conductive Sheets

For each of the above thermally conductive sheets, the proportion of the mass of the silicon compound to the total mass of the matrix and the silicon compound was obtained as follows.

For each of the thermally conductive sheets containing the alkoxysilane compound, the amount obtained by subtracting the difference between the mass of the thermally conductive sheet before curing and the mass of the thermally conductive sheet after curing (the value of the amount decreased) from the amount of the alkoxysilane compound blended in the thermally conductive composition was taken as the content of the alkoxysiloxane compound.

For each of the thermally conductive sheets containing the alkoxysiloxane compound, the difference between the mass of the thermally conductive sheet before curing and the mass of the thermally conductive sheet after curing (the value of the amount decreased) was generally 0, and therefore the amount of the alkoxysiloxane compound blended in the thermally conductive composition was taken as the content of the alkoxysiloxane compound.

Next, the amount of the precursor of the matrix blended in the thermally conductive composition was taken as the content of the matrix in the thermally conductive sheet, and the above proportion of mass was obtained.

The content of the silicon compound and the matrix comprised in the thermally conductive sheet may be obtained by well-known qualitative and quantitative analysis such as gas chromatography mass spectrometry (GC/MS), time-of-flight mass spectrometry (TOF/MS), or liquid chromatography/mass spectrometry (LC/MS).

The results are shown in the "Proportion of mass of silicon compound" columns in Table 1 and Table 2.

Thermal Conductivity of Thermally Conductive Sheets

The thermal conductivity of the above thermally conductive sheets was measured by a method in accordance with ASTM D5470-06 using a thermal resistance measuring machine.

As shown in FIG. 1, the thermal resistance measuring machine comprises a first copper block 12 and a second copper block 13 whose side surfaces are covered with a heat insulating material 11. The first copper block 12 is set up in the lower portion of the thermal resistance measuring machine, and the second copper block 13 is set up above the first copper block 12. The upper surface of the first copper block 12 is a loading surface P1 on which a test piece S of the thermally conductive sheet is to be loaded, and the dimensions of this loading surface P1 are 25.4 mm×25.4 mm. The thermal resistance measuring machine further comprises a heater 14 for heating the lower surface of the first copper block 12, and a heat sink 15 with a fan for cooling the upper surface of the second copper block 13. The thermal resistance measuring machine further comprises a cylinder 16 connected to the second copper block 13. The second copper block 13 is configured to compress the test piece S placed on the loading surface P1 of the first copper block 12 by the pressing operation of the cylinder 16.

For the measurement of the thermal conductivity, first, the test piece S was set up between the first copper block 12 and the second copper block 13, and the test piece S was compressed so that the compression rate in the thickness direction was 10%. Next, the heater 14 was allowed to generate heat so that the temperature of the loading surface P1 of the first copper block 12 was 80° C. The test piece S was allowed to stand for 15 min so that the temperature of the loading surface P1 of the first copper block 12 (temperature $\theta_{j1}$) was in a steady state at 80° C., and then the temperature of the lower surface P2 (the contact surface in contact with the test piece S) of the second copper block 13 (temperature $\theta_{j0}$) was measured. Further, the amount of heat generated in the heater 14 (the amount of heat generated, Q) at this time, and the thickness of the test piece S (thickness T) were measured. The value of the thermal resistance of the test piece S calculated from the following formula (3) was substituted into the following formula (4) to obtain the thermal conductivity.

$$\text{thermal resistance} = (\theta_{j1} - \theta_{j0})/Q \qquad (3)$$

$$\text{thermal conductivity} = T/\text{thermal resistance} \qquad (4)$$

The results are shown in the "Thermal conductivity" columns in Table 1 and Table 2.

Hardness of Thermally Conductive Sheets

The hardness of the above thermally conductive sheets was measured according to the provisions of JIS K6253 with a type E durometer. The results are shown in the "E hardness" columns in Table 1 and Table 2.

TABLE 1

|  |  | Example 1 | Example 2 | Example 3 | Example 4 | Comparative Example 1 | Comparative Example 2 | Comparative Example 3 |
|---|---|---|---|---|---|---|---|---|
| Amount of matrix precursor blended |  | 100 | 100 | 100 | 100 | 100 | 130 | 170 |
| Silicon compound | Amount of alkoxysilane compound blended | 5 | 15 | 55 | 70 | 0 | 0 | 0 |
| Amount of thermally conductive filler (A) blended |  | 220 | 220 | 220 | 220 | 220 | 220 | 220 |
| Amount of thermally conductive filler (B) blended |  | 500 | 500 | 500 | 500 | 500 | 500 | 500 |
| Amount of thermally conductive filler (C) blended |  | 10 | 10 | 10 | 10 | 10 | 10 | 10 |
| Amount of plasticizer blended |  | 65 | 55 | 15 | 0 | 70 | 40 | 0 |
| Viscosity of thermally conductive composition [Pa · s] |  | 240 | 200 | 100 | 60 | 600 | 500 | 400 |
| Proportion of mass of silicon compound [% by mass] |  | 0.5 | 1.5 | 5.2 | 6.5 | 0 | 0 | 0 |
| Thermal conductivity [W/m · K] |  | 16 | 20 | 27 | 29 | 8 | 11 | 13 |
| E hardness |  | 28 | 32 | 40 | 50 | 10 | 13 | 30 |

TABLE 2

|  |  | Example 5 | Example 6 | Example 7 | Example 8 |
|---|---|---|---|---|---|
| Amount of matrix precursor blended |  | 100 | 100 | 100 | 100 |
| Silicon compound | Amount of alkoxysilane compound blended | 0 | 0 | 0 | 15 |
|  | Amount of alkoxysiloxane compound blended | 15 | 55 | 70 | 40 |
| Amount of thermally conductive filler (A) blended |  | 220 | 220 | 220 | 220 |
| Amount of thermally conductive filler (B) blended |  | 500 | 500 | 500 | 500 |
| Amount of thermally conductive filler (C) blended |  | 10 | 10 | 10 | 10 |
| Amount of plasticizer blended |  | 55 | 15 | 0 | 15 |
| Viscosity of thermally conductive composition [Pa · s] |  | 220 | 150 | 90 | 200 |
| Proportion of mass of silicon compound [% by mass] |  | 13 | 35.5 | 41.1 | 16 |
| Thermal conductivity [W/m · K] |  | 17 | 18 | 18 | 25 |
| E hardness |  | 20 | 10 | 8 | 15 |

As shown in Table 1 and Table 2, the thermal conductivity of the thermally conductive sheets of the Examples is higher than that of the thermally conductive sheets of the Comparative Examples. The values of the E hardness of the thermally conductive sheets of the Examples are E50 or less, and it is found that in the thermally conductive sheets of the Examples, moderate flexibility is obtained. The values of the E hardness of the thermally conductive sheets of Examples 5 to 8 are E20 or less, and it is found that the thermally conductive sheets of Examples 5 to 8 are excellent in flexibility. The thermally conductive sheet of Example 6 had more suitable strength for handling than the thermally conductive sheet of Example 7. The thermally conductive sheet of Example 8 was excellent in both thermal conductivity and flexibility.

The invention claimed is:

1. A thermally conductive sheet comprising:
    a matrix composed of an organopolysiloxane having a crosslinked structure;
    a thermally conductive filler comprising a graphitized carbon fiber dispersed in the matrix; and
    at least one silicon compound selected from the group consisting of alkoxysilane compounds and alkoxysiloxane compounds,
    wherein a proportion of a mass of the silicon compound to a total mass of the matrix and the silicon compound is 0.1% by mass or more and 50% by mass or less, and
    wherein the silicon compound comprises a compound in which a proportion of decrease in mass is in the range of 5% or more and 60% or less at a point in time when 60 min has passed from a heating start in a thermogravimetric analysis under a condition where temperature is elevated to 100° C. from a heating start temperature of 25° C. at a heating up rate of 10° C./min and then kept constant at 100° C.

2. The thermally conductive sheet according to claim 1, wherein the silicon compound comprises the alkoxysilane compound, and
    a proportion of the mass of the alkoxysilane compound to a total mass of the matrix and the alkoxysilane compound is 0.1% by mass or more and 10% by mass or less.

3. The thermally conductive sheet according to claim 1, wherein the silicon compound comprises the alkoxysiloxane compound, and
    a proportion of a mass of the alkoxysiloxane compound to a total mass of the matrix and the alkoxysiloxane compound is 5% by mass or more and 50% by mass or less.

4. The thermally conductive sheet according to claim 1, wherein the silicon compound further comprises a compound in which a proportion of decrease in mass is less than 5% at a point in time when 60 min has passed from a heating start in a thermogravimetric analysis under a condition where temperature is elevated to 100° C. from a heating start temperature of 25° C. at a heating-up rate of 10° C./min and then kept constant at 100° C.

5. The thermally conductive sheet according to claim 1, wherein the silicon compound comprises a compound having an alkyl group bonded to a silicon atom.

* * * * *